United States Patent [19]
Perrett et al.

[11] Patent Number: 6,018,275
[45] Date of Patent: Jan. 25, 2000

[54] PHASE LOCKED LOOP WITH DOWN-CONVERSION IN FEEDBACK PATH

[75] Inventors: Alan Christopher Perrett, Surrey; Kenneth Peter Mason, Hampshire, both of United Kingdom

[73] Assignee: Nokia Mobile Phones Limited, Espoo, Finland

[21] Appl. No.: 08/993,268

[22] Filed: Dec. 18, 1997

[30] Foreign Application Priority Data

Dec. 23, 1996 [GB] United Kingdom ................... 9626715

[51] Int. Cl.[7] .............................. H03C 3/00; H04L 27/04; H04L 27/12; H04L 27/20

[52] U.S. Cl. ........................ 332/127; 332/100; 332/103; 332/120; 332/144; 332/145; 332/151; 331/23; 375/300; 375/302; 375/306; 375/308; 455/108; 455/113

[58] Field of Search ..................... 332/119, 127, 332/128, 144, 145, 151, 100–105, 120; 331/23; 455/42, 47, 108–113, 260; 375/300–308

[56] References Cited

U.S. PATENT DOCUMENTS

| | | | |
|---|---|---|---|
| 2,958,768 | 11/1960 | Brauer | 332/127 X |
| 3,644,831 | 2/1972 | Latker et al. | 332/127 X |
| 3,882,424 | 5/1975 | Debois et al. | 332/127 |
| 4,313,209 | 1/1982 | Drucker | 331/23 X |
| 4,447,792 | 5/1984 | Wynn | 332/128 |
| 4,449,250 | 5/1984 | Kurby | 332/128 X |
| 4,581,749 | 4/1986 | Carney et al. | 332/128 X |
| 4,706,047 | 11/1987 | Avila et al. | 332/127 X |
| 5,079,526 | 1/1992 | Heck | 332/127 |
| 5,160,900 | 11/1992 | Visuri | 331/18 |
| 5,291,474 | 3/1994 | Ikonen et al. | 370/30 |
| 5,301,367 | 4/1994 | Heinonen | 455/76 |
| 5,311,152 | 5/1994 | Lautzenhiser | 332/127 |
| 5,508,659 | 4/1996 | Brunet et al. | 331/16 |
| 5,734,302 | 3/1998 | Teng et al. | 332/128 |

FOREIGN PATENT DOCUMENTS

| | | |
|---|---|---|
| 0209754 A2 | 1/1987 | European Pat. Off. . |
| 1304825 | 1/1973 | United Kingdom . |
| 1502988 | 3/1978 | United Kingdom . |
| 2012506 | 7/1979 | United Kingdom . |
| 2247368 | 2/1992 | United Kingdom . |
| WO 95/16304 | 6/1995 | WIPO . |

*Primary Examiner*—David Mis
*Attorney, Agent, or Firm*—Perman & Green, LLP

[57] ABSTRACT

A transmitter and a phase locked loop (30) for a transmitter are disclosed. The phase locked loop (30) upconverts the frequency of a baseband signal to a frequency for radio transmission. As well as the usual components, the phase locked loop (30) comprises a modulator (39) for modulating a baseband signal ($f_{bb}$) onto a carrier ($f_{ref}/R$) and forwarding the resultant modulated signal ($f_c$) to one of the inputs of the phase detector (33). It also comprises a low pass filter (38) in its forward path between the phase detector (33) and the voltage controlled oscillator (34) for passing signals having baseband signal frequencies. A mixer (35) and main frequency divider (36) are provided in the feedback path to downconvert the transmit signal ($f_{tx}$). This low division eliminates large amounts of multiplicative noise within the loop bandwidth, and therefore enables a large loop bandwidth to be used. Consequently, the settling time of the phase locked loop is improved.

41 Claims, 7 Drawing Sheets

PHASE LOCKED LOOP WITH DOWN-CONVERSION IN FEEDBACK PATH

BACKGROUND OF THE INVENTION

The present invention relates to a radio transmitter. In particular, it relates to a transmitter architecture for cellular mobile phones. Such an architecture has a phased lock loop (PLL).

There are traditionally two types of transmitter, on-channel and offset.

Figure 1:
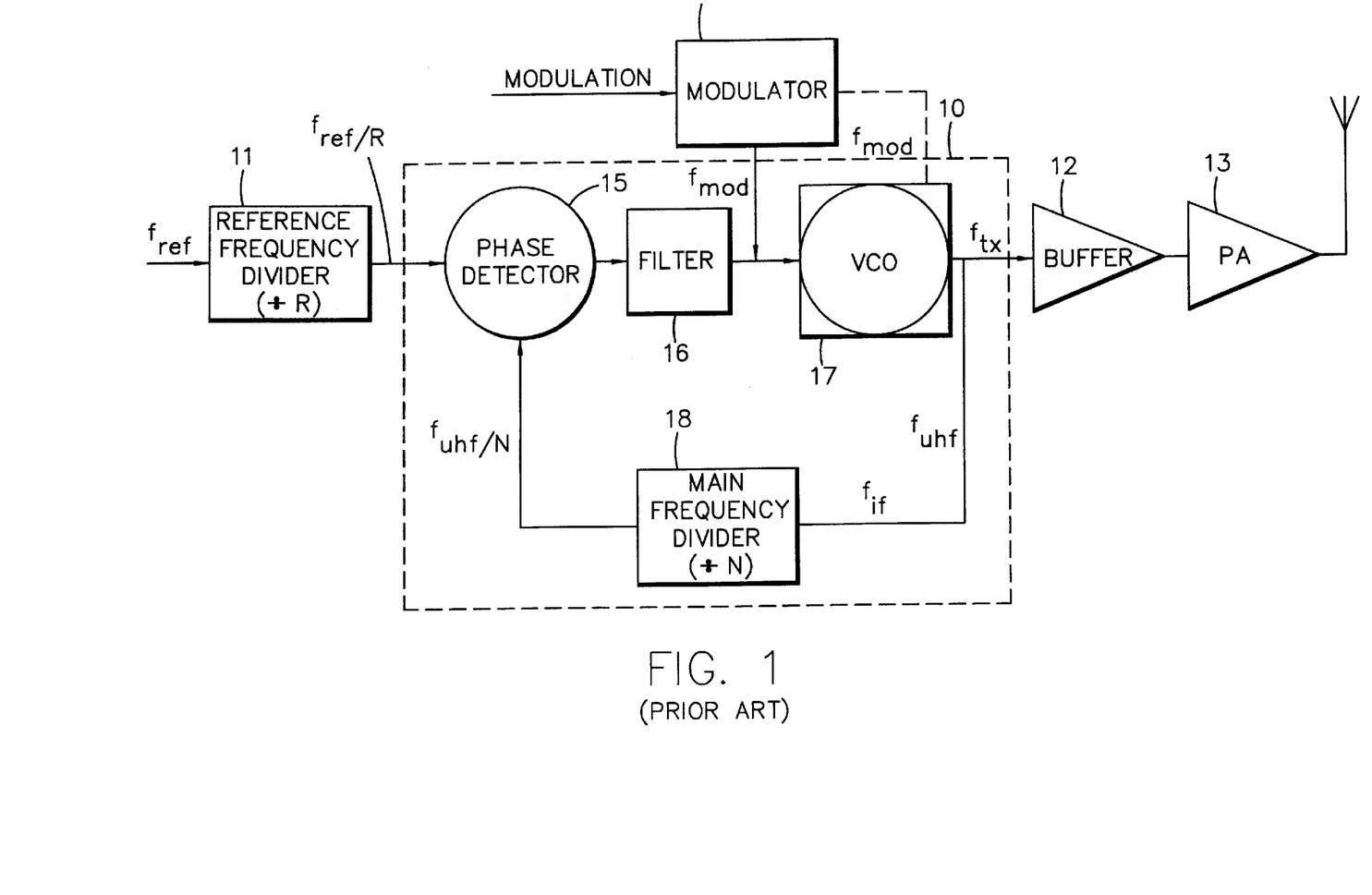
FIG. 1 illustrates an on-channel transmitter.

FIG. 1 of the accompanying drawings illustrates an on-channel transmitter. This transmitter comprises a PLL 10, a reference frequency divider 11, a transmitter buffer 12, a power amplifier (PA) 13 and a modulator 14. The PLL 10 consists of a phase detector 15, a low pass filter (LPF) 16, a voltage controlled oscillator (VCO) 17 and a frequency divider 18. The bandwidth of the PLL 10 is proportional to the bandwidth of the LPF 16 and is a compromise between being small enough to eliminate noise and yet sufficiently large for the loop to have a fast enough response to perturbations.

In operation, the PLL acts as follows. The phase detector multiplies the frequency divided incoming (reference) signal $f_{ref}/R$ by the frequency divided signal output from the VCO 17, $f_{uhf}/N$. Typically, the phase detector 15 generates a pulse width modulated signal, which is either a current or voltage signal, and which is proportional to the phase difference between the two input signals, $f_{ref}/R$ and $f_{uhf}/N$. The resultant voltage is filtered by the low pass filter 16 to generate a DC voltage, the amplitude of which governs the frequency of operation of the VCO 17. Modulation is applied by a modulator 14 either by summing the voltage at the output of the filter (solid line in FIG. 1) or by having a separate modulation control to the VCO 17 (dotted line in FIG. 1). The loop ideally keeps the phase difference between the aforementioned signals $f_{ref}/R$ and $f_{uhf}/N$ to zero. Accordingly, the VCO 17 outputs a phase locked signal $f_{uhf}$.

In the transmitter of FIG. 1, the output of the PLL is ramped up by the transmitter buffer 12 and then amplified by the PA 13. However, because the VCO frequency equals the transmit frequency, the PLL is affected by a PA kick which occurs when the PA 13 operates. The output of the VCO 17, namely $f_{uhf}$, is affected. This causes an adjustment in the output of the phase detector 15 to indicate a phase difference between $f_{ref}/R$ and $f_{uhf}/N$, which, in turn, alters the output of the VCO 17. Consequently, a settling time is incurred in reducing the phase difference to zero.

The smaller the bandwidth of the PLL, the greater the settling time. The low loop requirements for analogue systems such as AMPS (advanced mobile phone system), NAMPS (narrowband AMPS), and TACS (total access communication system) results in an unacceptable settling time. For example, the specification for AMPS requires the transmit frequency to reach a final frequency within 2 ms of the PA operating. The PLL does not react quickly enough to PA kick to achieve this maximum 2 ms settling time.

The effect of PA kick, and also radiated transmit kick, is reduced by including large amounts of load insulation (buffer 12).

However, the problem is generally overcome by utilising an offset transmitter in such narrow band systems.

Figure 2:
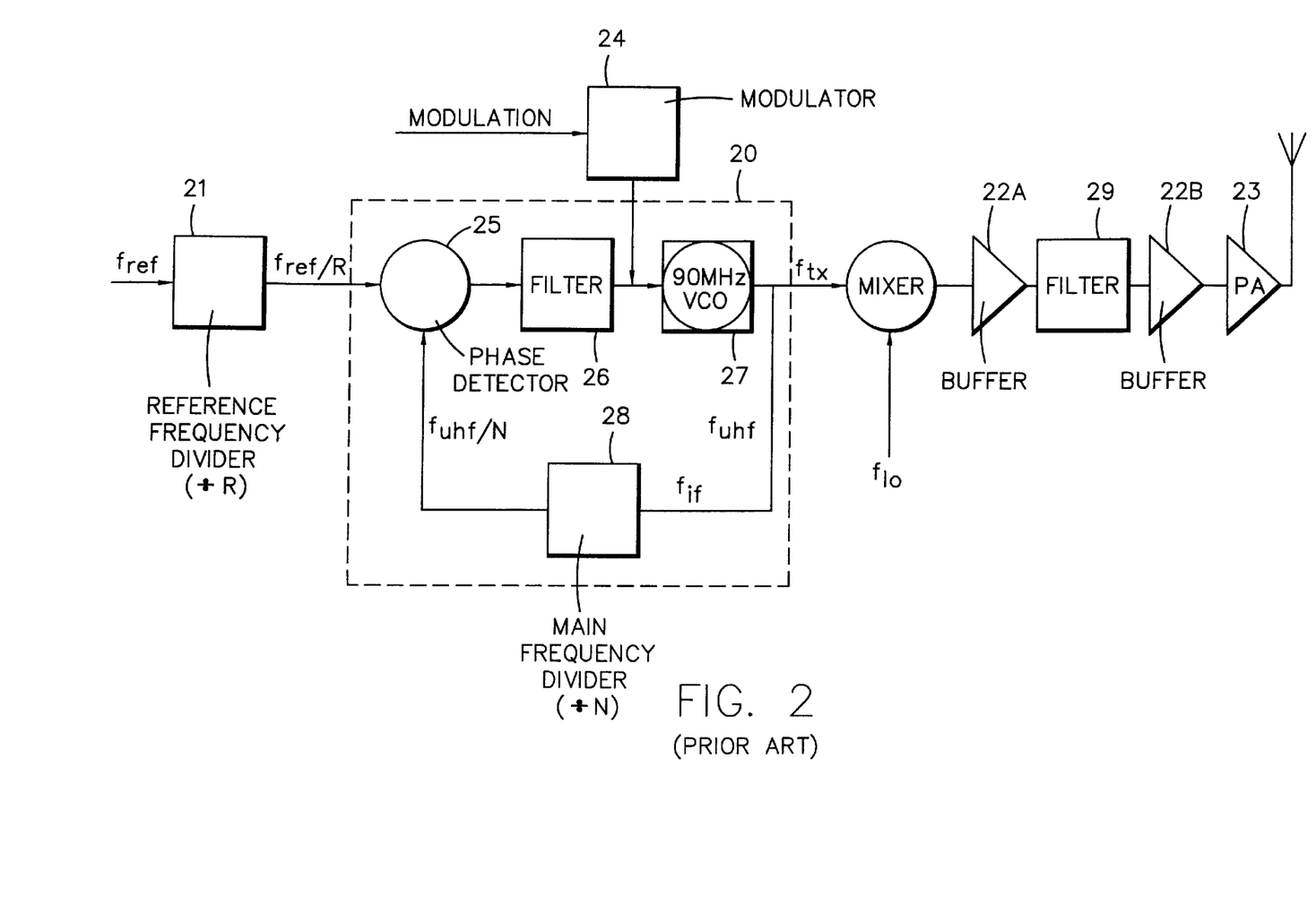
FIG. 2 illustrates an offset transmitter.

FIG. 2 of the accompanying drawings illustrates an offset transmitter. This transmitter comprises a phase locked loop (PLL) 20, a reference frequency divider 21, a modulator 24, a mixer 19, transmitter buffers 22a and 22b, a band pass filter (BPF) 29 and a power amplifier (PA) 23. The PLL 20 has the same components as the on channel PLL 10 and operates as described above. That is, it consists of a phase detector 25, a low pass filter (LPF) 26, a voltage controlled oscillator (VCO) 27 and a frequency divider 28. However, the VCO operates at VHF and is therefore less susceptible to PA kick. Because the disturbance is less, the fact that the settling time is extended is of less consequence and accordingly, the transmitter can modulate to low frequencies, such as those utilised in NAMPS.

In the offset transmitter of FIG. 2, the output of the PLL 20, $f_{rf}$, is mixed with a low frequency signal $f_{lo}$ to obtain an intermediate frequency $f_{if}$. $f_{if}$ is $f_{rf}+f_{lo}$ and $f_{rf}-f_{lo}$. Since this signal is typically a low output, more gain stages (transmitter buffers 22a and 22b) are required than in the on channel system. Also, these buffers are needed, as in the on-channel transmitter, to reduce the effects of any frequency kicks. Further, the signal needs to be "cleaned" prior to amplification by the PA 23. This is achieved by a band pass filter 29, such as a SAW filter. These additional components are expensive and take up a considerable amount of space on a PCB.

SUMMARY OF THE INVENTION

According to the present invention, there is provided a phase locked loop for upconverting the frequency of a baseband signal to a frequency for radio transmission, the phase locked loop comprising:
  an input to which a signal having a reference frequency is applied;
  an output for outputting the signal for radio transmission;
  a filter in its forward path for passing the baseband signal;
  a mixer and a frequency divider in its feedback path for downconverting the frequency of the signal output to substantially the reference frequency; and
  a modulator coupled to the input or the feedback path for modulating the baseband signal onto the signal having the respective reference frequency or downconverted frequency.

An advantage of such a phase locked loop is that it has very low division, and thus does not suffer from large amounts of multiplicative noise within its bandwidth. Also, it modulates within the loop bandwidth. Consequently, the phase locked loop can have a large loop bandwidth which, in turn, enables a fast settling time to be achieved.

Preferably, the modulator comprises a phase modulator. Phase modulators are simple, inexpensive devices. Further, phase modulation is less complex than alternative modulation methods, and therefore tends to be easier to realise. It may also comprise an integrator for integrating the baseband signal. This ensures, where necessary, that the action of the phase modulator gives overall frequency modulation. The modulator may also comprise an amplitude modulator, for use, for example, in a digital transmitter.

The upconversion may be from one frequency band to another two bands higher. For example, from LF to HF, MF to VHF, HF to UHF. Alternatively, it may jump even more frequency bands, such as from LF to UHF. Such upconversion has the advantage that it reduces the power consumption required at the input stage.

For an audio baseband signal, the filter in the forward path of the phase locked loop is preferably a low pass filter which passes signals having audio frequencies. For example, it may pass signals having frequencies up to around 20 kHz.

The phase locked loop may comprise a frequency source coupled to the mixer. This frequency source generates a frequency similar to that of the output signal, so that the resultant signal is of a frequency similar to the reference frequency. This enables the absolute value of division by the frequency divider to be reduced. Hence, it has the advantage of reducing the amount of noise which would be multiplied by the frequency divider. Preferably the frequency of the signal generated by the frequency source is in the same frequency band as the frequency of the output signal.

If the phase locked loop is part of a transceiver architecture, then it is preferably arranged such that the frequency source is the receiver's frequency source. This then reduces the number of components required, which reduces cost and the size of the transceiver.

According to another aspect of the present invention, there is provided a radio transmitter comprising a phase locked loop as described above.

Preferably, the transmitter comprises a power amplifier for amplifying the signal output by the phase locked loop.

The radio transmitter may further comprise means for decomposing the baseband signal into a complex signal having a phase part and an amplitude part. In such a transmitter the power amplifier is a variable amplifier which is responsive to the amplitude of the baseband signal, and the modulator is arranged to modulate the phase part of the baseband signal onto the signal having the respective reference frequency or downconverted frequency. It is then capable of providing amplitude modulation as well as phase or frequency modulation. Such a transmitter can be used in digital communications systems, for example.

The radio transmitter may further comprise a frequency divider, so that a signal of higher frequency than the required reference frequency can be input. Further, in the case of a transceiver, it enables a frequency source of the receiver to be utilised. Hence, it reduces the number of frequency sources required, thus reducing cost and space in the transceiver.

DETAILED DESCRIPTION OF EMBODIMENTS OF THE INVENTION

Figure 3:
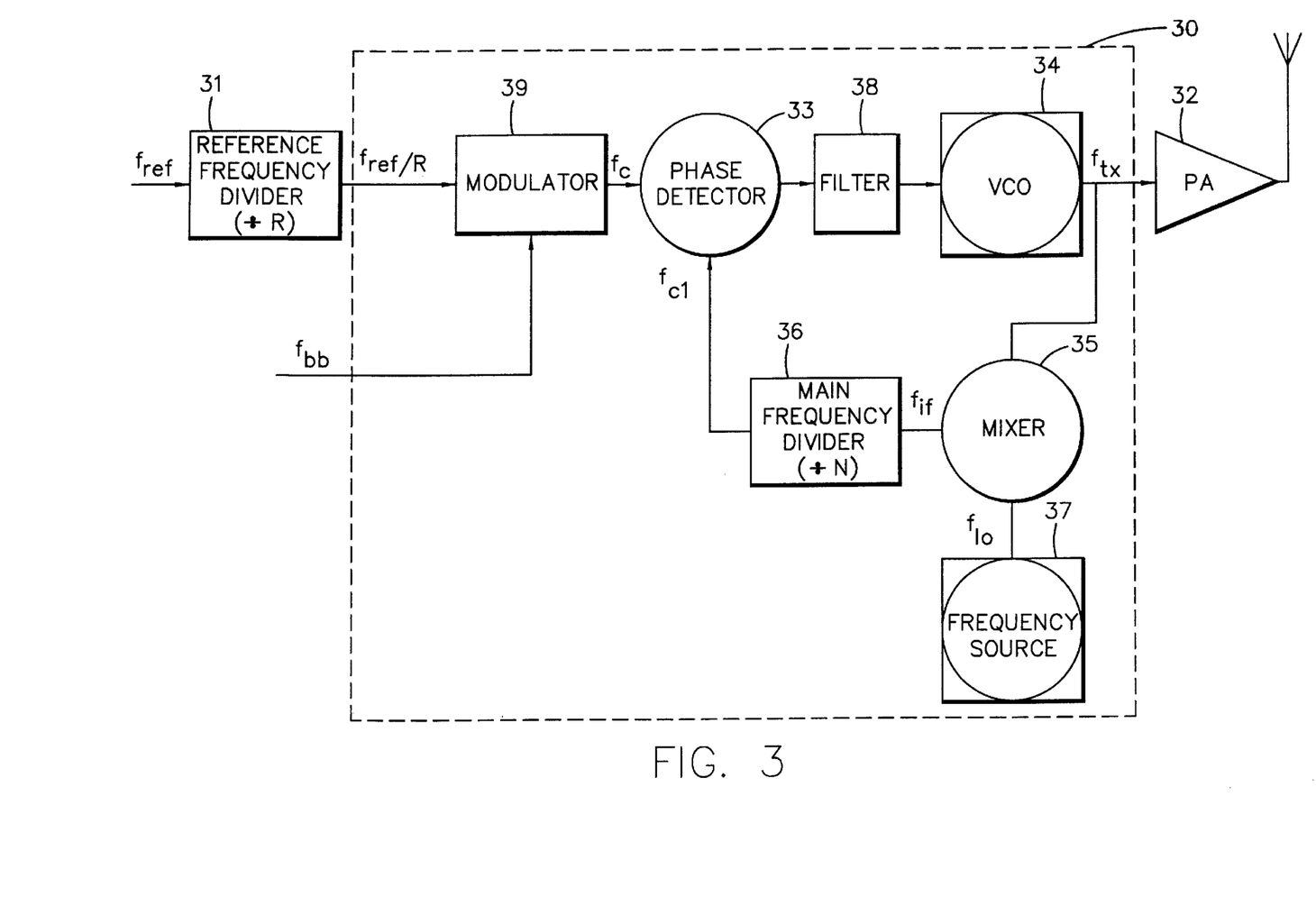
FIG. 3 illustrates a transmitter according to one embodiment of the present invention.

Embodiments of the present invention will now be described, by way of example, will reference to the accompanying drawings, of which:

FIG. 3 illustrates a transmitter of one embodiment of the present invention. The transmitter comprises a PLL 30, which upconverts the frequency of a baseband signal to a frequency for baseband transmission, a reference frequency divider 31 and a power amplifier 32.

The reference frequency divider 31 enables an appropriate reference frequency $f_{ref}/R$ to be obtained from a larger frequency $f_{ref}$. That is, it divides $f_{ref}$ by a division factor R. This reference frequency divider 31 can be dispensed with if a frequency source provides the appropriate reference frequency $f_{ref}/R$.

The power amplifier 32 amplifies the output of the PLL 30 to a suitable level for radio transmission.

The phase locked loop 30 comprises the conventional components, namely a phase detector 33 and a voltage controlled oscillator 34 in a forward path, and a feedback path from the output of the VCO 34 to the phase detector 33. However, it also comprises a mixer 35, a main frequency divider 36, a frequency source 37, a low pass filter 38 and a modulator 39.

The low pass filter 38 is positioned in the forward path between the phase detector 33 and the VCO 34. Like its counterpart in the on-channel transmitter of FIG. 1, the low pass filter 38 controls the bandwidth of the PLL 30. It is chosen to pass signals of baseband frequencies, and to filter out other frequencies, in particular the reference frequency, $f_{ref}/R$. For example, the low pass filter for an audio baseband signal might pass frequencies of 20 kHz or less, but block those over 20 kHz.

The mixer 35 is provided to downconvert the frequency of the signal output from the PLL 30. It mixes signals at its two inputs to generate a signal having a difference frequency. One of the inputs is connected to the output of the PLL 30 and the other is connected to the frequency source 37. Hence, the closer the frequency generated by the frequency source 37 and the output frequency, the smaller the difference frequency output by the mixer 35, and thus the greater the downconversion. The downconversion by the mixer 35 reduces the absolute value N of frequency division required by the frequency divider 36.

This main frequency divider 36 is used to change the offset between the transmit and receive channels.

The modulator 39 modulates the baseband signal $f_{bb}$ onto the divided reference signal $f_{ref}/R$. It is coupled to the input of the PLL, that is, to one of the inputs of the phase comparator 33 so that the resultant modulated signal $f_c$ can be compared with the signal $f_{c1}$ fed back to the other phase comparator input. The modulation process introduces a delay or advance of the edge of the divided reference signal $f_{ref}/R$ by an amount relative to the amplitude of the modulating waveform (baseband signal). The delay is related to the phase shift by $\tau = \omega \cdot \phi$, where $\tau$ is the introduced delay (or advance), $\omega$ is the angular frequency of the resultant modulated signal $f_c$ and $\phi$ is the phase shift. The maximum phase shift required is represented by the modulation index $\beta$, and is determined by the peak frequency deviation of the system $\Delta \omega$ divided by the modulating frequency $\omega_{mod}$ ($\beta = \Delta \omega / \omega_{mod}$). Modulation generated at the carrier frequency, $f_c = f_{ref}/R$ occurs at the transmit frequency, $f_{tx}$, also. Since the loop acts as a frequency multiplier, the transmit frequency $f_{tx} = f_{lo} - N \cdot f_c$ (where $f_{lo} > f_{tx}$) or $f_{tx} = f_{lo} + N \cdot f_c$ (where $f_{lo} < f_{tx}$). The action of the loop causes multiplication of the modulated signal by N. So, if the modulation index $\beta$ is required at the transmit frequency $f_{tx}$, then $\beta/N$ is required at $f_c$ to produce this effect. Consequently, the modulation process can be thought of as a variable delay, which is varying at the rate of the modulating frequency $f_{bb}$, with a peak amplitude dependent upon the modulating waveform amplitude. That is, phase modulation.

Operation of the PLL 30 of this embodiment will now be described. The baseband signal $f_{bb}$ is modulated onto the divided reference frequency $f_{ref}/R$ by the modulator 39 and the resultant modulated signal $f_c$ is applied to one of the inputs of the phase detector 33. The fed back signal $f_{c1}$ from the output of the PLL 30 is applied to the other phase detector input. The phase detector 33 multiplies these two signals and the resultant signal is output to the low pass filter 38. This filter generates the modulating signal $f_{bb}$. That is, it passes the signals with the baseband frequencies, and blocks those outside the baseband frequency range. The generated modulating signal is applied to the VCO 34. The VCO 34 outputs a signal $f_{tx}$ having a peak frequency shift $\Delta f_{tx}$ proportional to the amplitude of the applied modulating signal, leading to a peak frequency deviation of $f_{tx} \pm \Delta f_{tx}$. The VCO output signal $f_{tx}$ has a frequency high enough for radio transmission. This signal is output from the PLL 30 to the power amplifier 32 for amplification, and then on to the antenna for radio transmission. It is also applied to the feedback path of the PLL 30, where its frequency is downconverted.

The mixer mixes the VCO output signal with that provided by the frequency source 40, and outputs a downconverted signal $f_{if}$. This downconverted signal $f_{if}$ is then divided by the main frequency divider 36 to further downconvert the signal $f_{if}$ and thus generate a signal of frequency $f_{c1}$ which, when the loop is locked, equals $f_c$. Alternatively, rather than frequency dividing the signal $f_{if}$ output from the mixer, the main frequency divider 36 could frequency divide the signal $f_{lo}$ from the frequency source and then input the resultant frequency divided signal to the mixer input.

The phase detector compares the signals $f_c$ and $f_{c1}$ and the PLL 30 adjusts the output if necessary until the loop is locked.

The main frequency divider 36 is used to change the offset between the transmit and receive channels.

Figure 5:
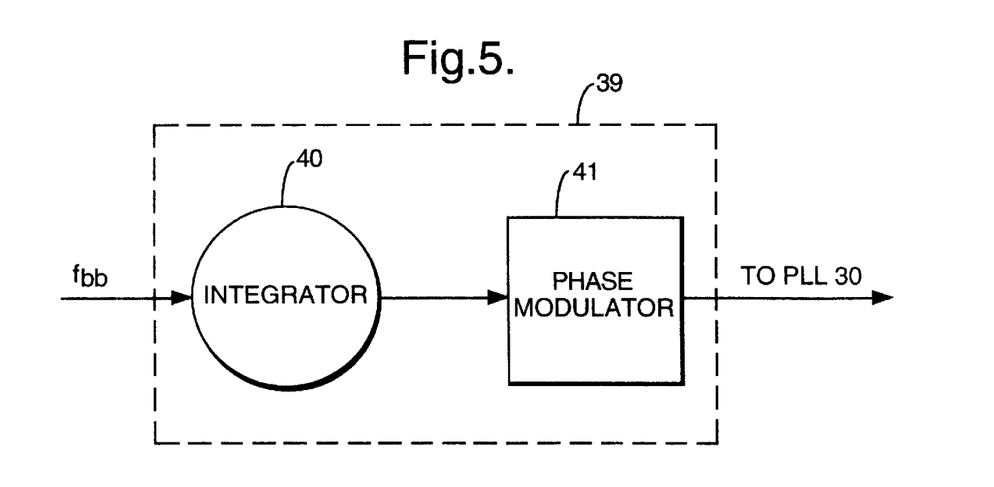
FIG. 5 illustrates a modulator according to an embodiment of the present invention.

As shown in FIG. 5, the modulator may comprise an integrator 40 and a phase modulator 41. The addition of the integrator 40 makes the delay proportional to the amplitude and inversely proportional to the frequency of the modulating waveform. That is, it enables frequency modulation to be achieved by integrating the baseband signal $f_{bb}$ prior to phase modulation, since frequency is the time differential of phase (i.e. $f = d\phi/dt$). In this embodiment, the baseband signal is integrated by the integrator 40 and forwarded to the phase modulator 41. Phase modulation of the integrated baseband signal $f_{bb}$ onto the divided reference frequency $f_{ref}$ is effected and the resultant modulated signal $f_c$ is applied to one of the inputs of the phase detector 33.

The architecture shown in FIG. 3 is advantageous for a number of reasons. Ordinarily, noise added during phase modulation is output by the transmitter as that noise multiplied the factor N. However, by downconverting the frequency of the signal output by the VCO 34, the noise is reduced. Hence, a larger loop bandwidth is possible, resulting in a faster settling time for the PLL 30. This is further improved because the modulation occurs within the loop bandwidth.

The faster settling time leads to the VCO and power amplifier stages operating at substantially the same time, thus reducing the time gap between power up and lock. Consequently, the problem of power amplifier kick is overcome and isolation between the VCO and the antenna port is not required. Also, much higher levels of VCO output and much lower levels of total PA gain are possible, due to the absence of a mixer in the transmit path. For example, gain stages such as the transmitter buffers 22a and 22b in the prior art of FIG. 2 can be eliminated. Moreover, the lower gain means that, in a transceiver, lower levels of transmitter noise are generated in the receiver band. Consequently, the specification requirements of the duplexer may be reduced, enabling use of a cheaper filter. Alternatively, lower insertion loss may be taken advantage of to improve the efficiency of the transceiver.

Figure 4:
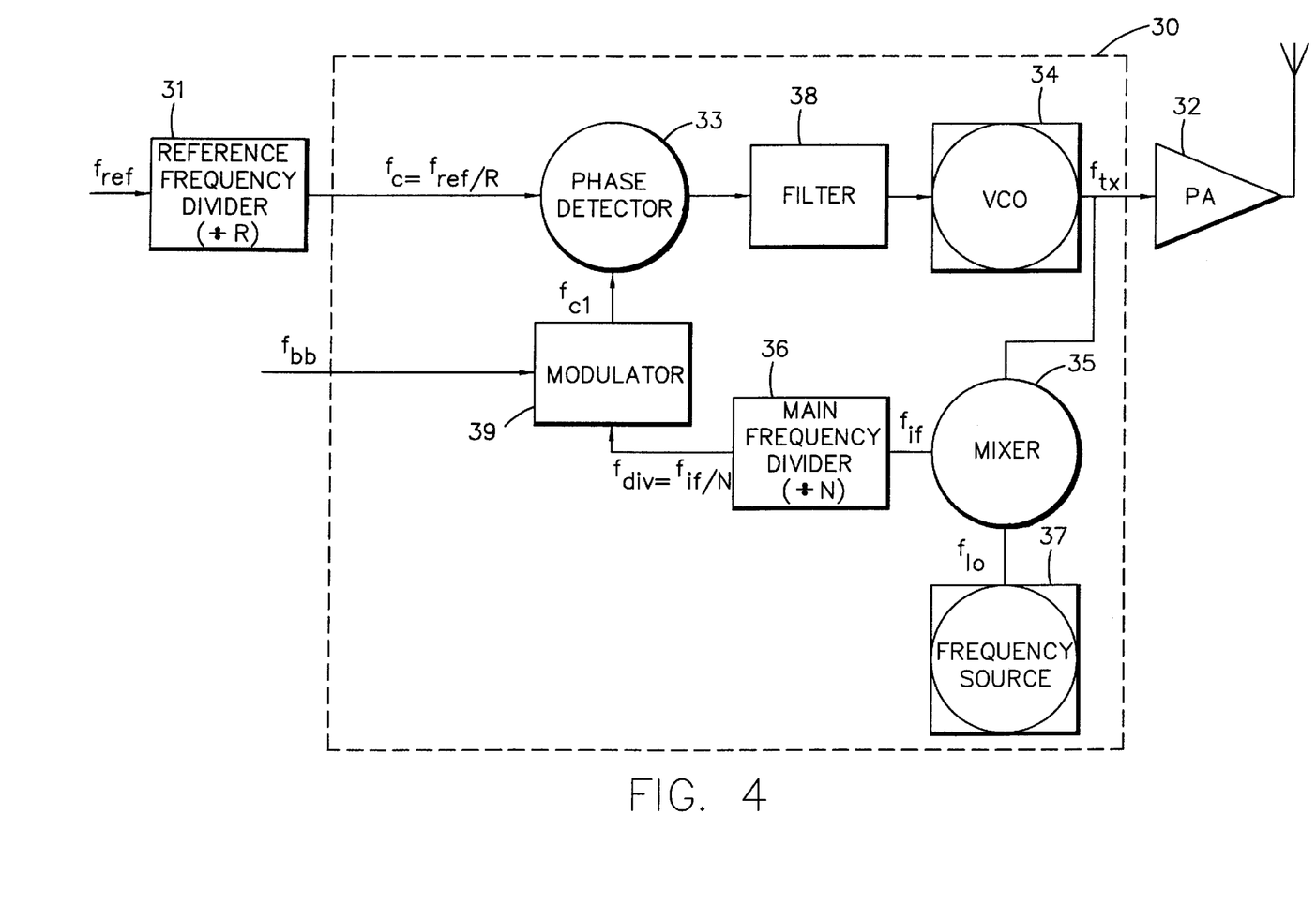
FIG. 4 illustrates a transmitter according to another embodiment of the present invention.

FIG. 4 illustrates a transmitter of another embodiment of the present invention. It is the same as that in FIG. 3, with one exception. The modulator 39 is in the feedback path of the PLL 30. That is, the modulator 39 modulates the baseband signal $f_{bb}$ onto the signal $f_{div}$ output by the main frequency divider and the resultant modulated signal $f_{c1}$ is fed to one of the phase detector inputs. The modulator may comprise an integrator and phase modulator, as shown in FIG. 5 and described above.

In operation, the output $f_c = f_{ref}/R$ of the reference frequency divider 31 is fed to the other phase detector input for comparison with the resultant modulated signal $f_{c1}$. The phase detector 33 multiplies these two signals and the resultant signal is output to the low pass filter 38. As in the FIG. 3 embodiment, this filter generates the modulating signal $f_{bb}$. That is, it passes the signals with the baseband frequencies, and blocks those outside the baseband frequency range. The generated modulating signal is applied to the VCO 34. The VCO 34 outputs a signal $f_{tx}$ having a peak frequency shift $\Delta f_{tx}$ proportional to the amplitude of the applied modulating signal, leading to a peak frequency deviation of $f_{tx} \pm \Delta f_{tx}$. The VCO output signal $f_{tx}$ has a frequency high enough for radio transmission. This signal is output from the PLL 30 to the power amplifier 32 for amplification, and then on to the antenna for radio transmission. It is also applied to the feedback path of the PLL 30, where its frequency is downconverted.

The mixer mixes the VCO output signal with that provided by the frequency source 40, and outputs a downconverted signal $f_{if}$. This downconverted signal $f_{if}$ is then divided by the main frequency divider 36 to further downconvert the signal $f_{if}$ and thus generate the carrier signal for the modulator, namely the frequency divided signal $f_{div}$. As mentioned above, the modulator 39 modulates this signal by the modulating signal, (baseband signal $f_{bb}$), to produce the resultant modulated signal $f_{c1}$ which, when the loop is locked, equals $f_c$. Alternatively, rather than frequency dividing the signal $f_{if}$ output from the mixer 35, the main frequency divider 36 could frequency divide the signal $f_{lo}$ from the frequency source and then input the resultant frequency divided signal to the mixer input. In this event, the modulator 39 modulates the modulating signal $f_{bb}$ onto the signal $f_{if}$ output from the mixer 35.

The phase detector 33 compares the resultant modulated signal $f_{c1}$ with the signal $f_c$ at its other input and the PLL 30 adjusts the output if necessary until the loop is locked.

To change channel, the division factor N of the main frequency divider 36 is altered. This alters the frequency of its output signal $f_{div}$ and thus that of the resultant modulated signal $f_{c1}$. The resultant modulated signal $f_{c1}$ is forwarded to the phase detector 33, and the PLL 30 effects alteration of the VCO output frequency $f_{tx}$ accordingly.

Figure 6:
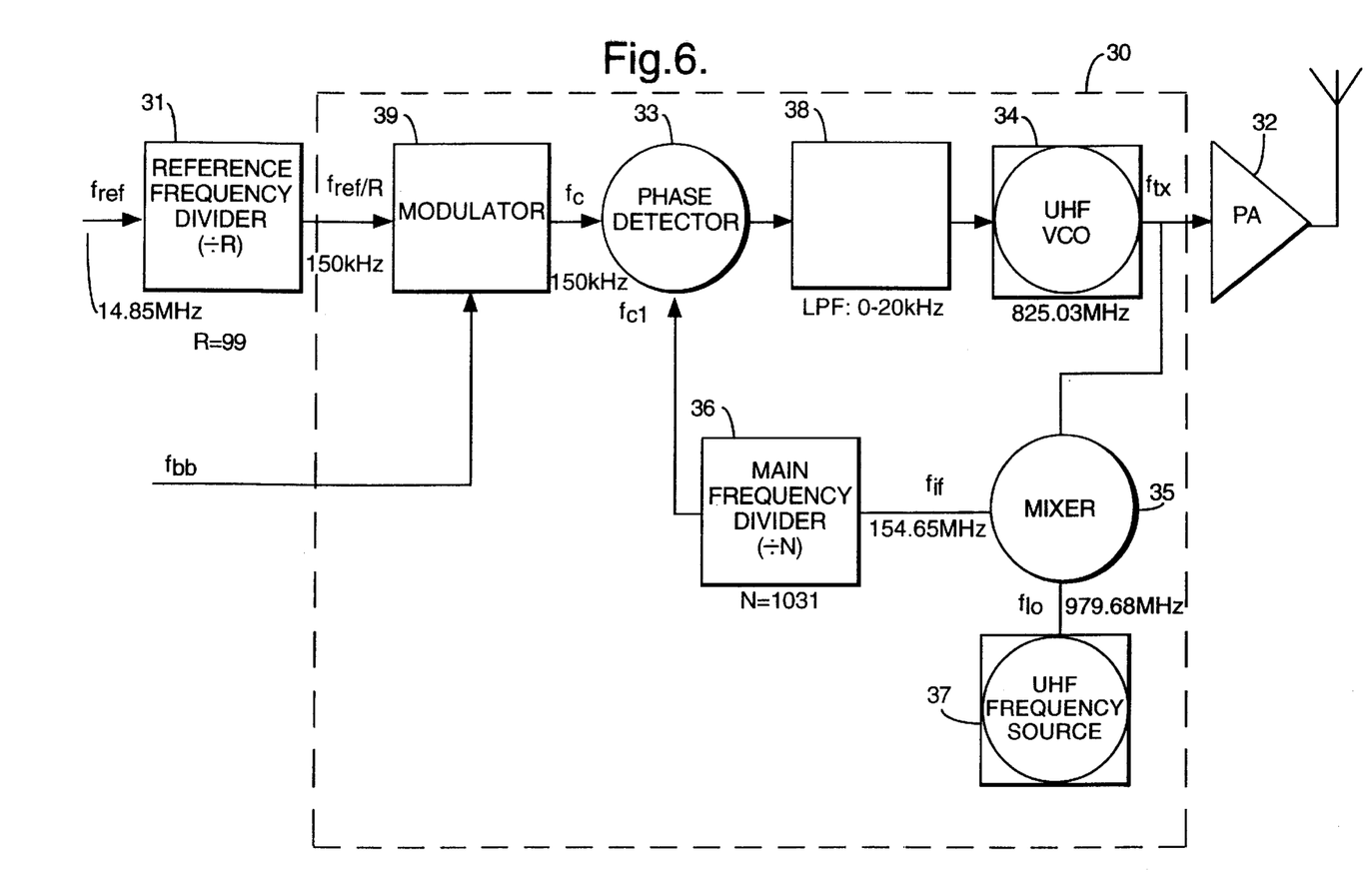
FIG. 6 illustrates a typical frequency upconversion by a PLL of the embodiment of FIG. 3.

FIG. 6 illustrates a typical frequency upconversion by a PLL of the embodiment of FIG. 3. A signal $f_{ref}$ of frequency 14.85 MHz is divided by the reference frequency divider 31 having a division factor R of 99. Consequently, the divided reference signal $f_{ref}/R$ has a frequency of 150 kHz, which is in the LF band. Assuming the baseband signal $f_{bb}$ to be an audio signal, it will have a frequency of 0–20 kHz, for example. Thus, the resultant modulated signal $f_c$ output by the modulator 39 has a frequency of 150 kHz with a phase and therefore frequency offset which is proportional to the modulation frequency amplitude, and frequency in the case of frequency modulation. The rate of change of this offset is equal to the modulating frequency.

The low pass filter 38 passes signals of audio frequency, i.e. up to 20 kHz. The signals passed are input to the VCO 34, which in this case is a UHF (e.g.900 MHz) VCO. The VCO upconverts the signals input to give output signals $f_{tx}$ which are in the UHF band. For example, if the transmitter is in the first channel, the output for no audio signal may be 825.03 MHz. This is mixed by the mixer 35 with a signal from the frequency source 37, which has a frequency of 979.68 MHz. That is, one which is also in the UHF band. Consequently, the mixer outputs the signal $f_{if}$ having the difference frequency between those of $f_{tx}$ and $f_{lo}$, namely 154.65 MHz. This frequency is in the VHF band. For the first channel, the division factor N of the main frequency divider 36 is N=1031. This further downconverts the frequency of the signal $f_{if}$ to 150 kHz, and the resultant signal $f_{c1}$ has the same frequency as $f_c$.

To change channel, the value of N is altered, so that $f_{c1} \neq f_c$. This results in a corresponding output from the phase detector 33 which is fed to the VCO 34 to alter the output of the PLL 30 accordingly.

Figure 7:
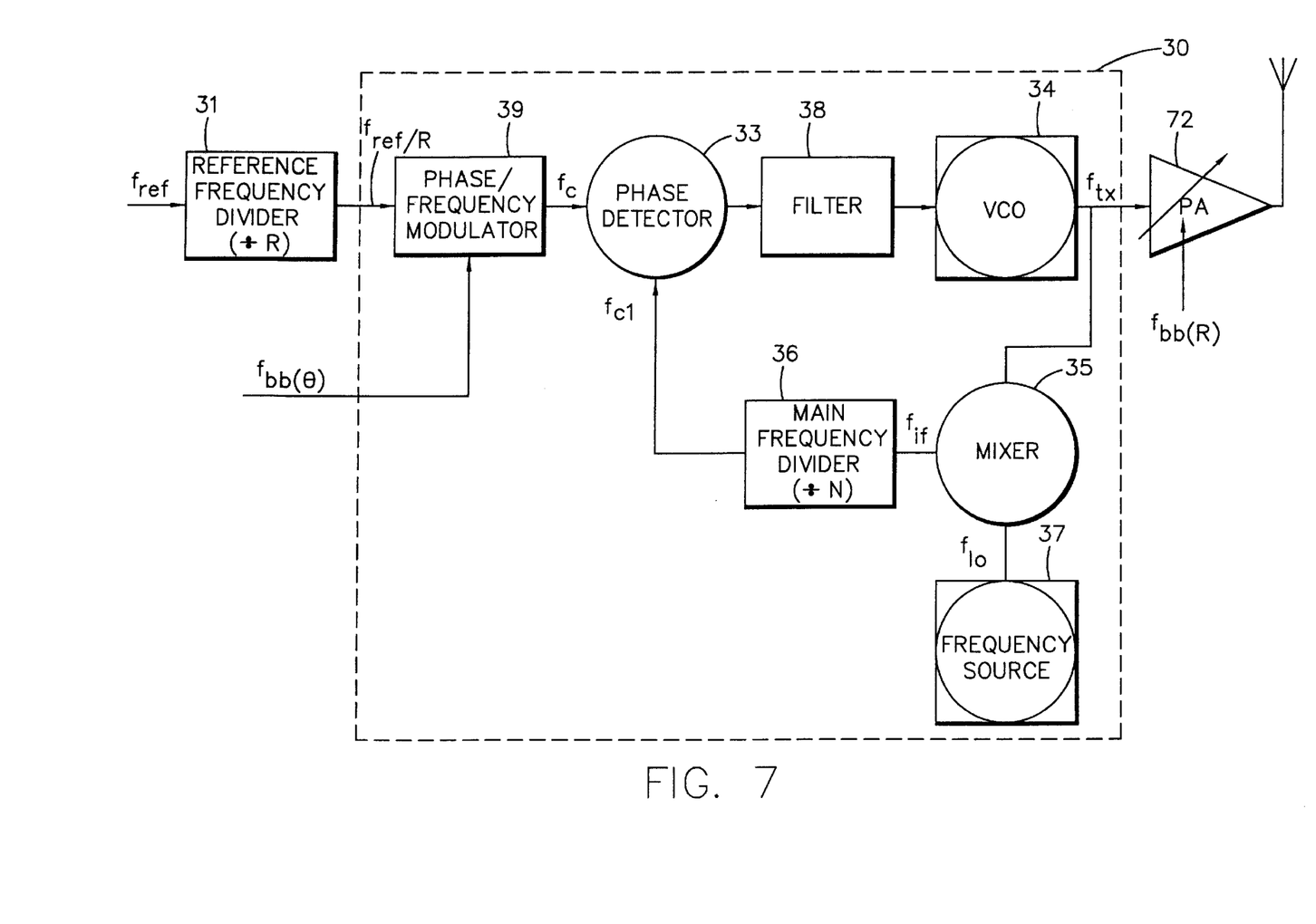
FIG. 7 illustrates a transmitter according to a further embodiment of the present invention.

FIG. 7 illustrates a transmitter of another embodiment of the present invention, which is capable of generating amplitude modulation, as well as phase or frequency modulation. Such a transmitter may be used in a number of digital communications systems which use a combination of phase and amplitude modulation, so as to reduce the bandwidth of the transmitted signal. An example of such a modulation scheme is π/4 quadrature phase shift keying (QPSK). Typically, this scheme involves decomposing the baseband signal into a complex signal and modulating it onto the carrier.

The transmitter shown in FIG. 7 is the same as that shown in FIG. 3, with two exceptions. Firstly, the power amplifier is a variable power amplifier 72. Secondly, the baseband signal $f_{bb}$ is decomposed into a complex signal of the form R<θ. The phase part of the signal, $f_{bb}$ (θ), is applied to an input of the phase/frequency modulator 39 so as to be modulated onto the carrier $f_{ref}/R$. The magnitude part of the signal $f_{bb}$ (R) is applied to the variable power amplifier 72 to vary the amplitude of its output signal $f_{tx}$.

Alternatively, the modulator 39 may comprise a conventional IQ modulator to modulate a complex signal in the mathematical form a +jb onto the carrier, $f_{ref}/R$, and thus provide amplitude and phase modulation. However, such a modulator is much more complex, and thus expensive.

Similarly, a transmitter which is capable of generating amplitude modulation as well as phase or frequency modulation may be based on the embodiment shown in FIG. 4.

In a transceiver, the frequency source 37 utilised can be that of the receiver. This reduces the number of components required and thus reduces cost and the size of the transceiver. Also, in analogue systems, there is a constant offset (e.g. 45 MHz) between the transmit and receive channels. Hence, the channel can be changed by changing the frequency of the signal output by the common frequency source 37, without having to change the value of N.

Since the input to the PLL 30 is in the order of kHz, power consumption at the input stage is reduced. The use of such low frequency input is possible by the utilisation of simple phase modulation.

This scheme also enables the modulation gain for different modulation waveforms to be the same. Examples of such different forms of modulation waveforms are as follows:

1. Audio. e.g. a 300 Hz to 3 kHz signal;
2. SAT. e.g. a 6 kHz tone;
3. Wideband data e.g. data with a maximum frequency of 20 kHz; and
4. Sub-audible data e.g. narrowband data with a maximum frequency of 160 Hz and a minimum frequency of 8 Hz.

As exemplified, data can be modulated as well as audio. In this case, the data spectrum should be capable of being controlled within the loop bandwidth and it should not be necessary for amplitude information to be impressed on the carrier.

It will be appreciated by those skilled in the art that the embodiments described are merely illustrative, and that various modifications may be made which fall within the scope of the claims.

What is claimed is:

1. A phase locked loop for upconverting and scaling the frequency of a baseband signal to a frequency for radio transmission, the phase locked loop comprising:

an input for application of a signal having a reference frequency;

an output for outputting an output signal for radio transmission;

a filter in a forward path of the loop for passing the baseband signal;

a mixer and a frequency divider in a feedback path of the loop, the mixer serving for downconverting the frequency of the loop output signal, the frequency divider connecting with an output terminal of the mixer and serving to scale the frequency of an output signal of the mixer to provide a signal having a downconverted frequency of substantially the reference frequency; and a modulator coupled to the input for modulating the baseband signal onto the signal having the reference frequency.

2. A phase locked loop as claimed in claim 1, wherein the modulator comprises a phase modulator.

3. A phase locked loop as claimed in claim 2, wherein the modulator further comprises an integrator, coupled to the phase modulator, for integrating the baseband signal.

4. A phase locked loop as claimed in claim 1, wherein the modulator comprises an IQ modulator.

5. A phase locked loop as claimed in claim 1, arranged such that the frequency bands in which the reference frequency and the frequency of the output signal lie are spaced by at least one further frequency band.

6. A phase locked loop as claimed in claim 5, arranged to output a signal having a frequency in the UHF band when the reference frequency is in the LF band.

7. A phase locked loop as claimed in claim 1, wherein the filter is a low pass filter for passing signals of audio frequency.

8. A phase locked loop as claimed in claim 1, further comprising a frequency source coupled to the mixer for generating a signal to be mixed with the output signal.

9. A phase locked loop as claimed in claim 8, wherein the frequency source is in the same frequency band as the frequency of the output signal.

10. A radio transmitter comprising a phased locked loop for generating from a baseband signal a signal to be transmitted by the transmitter, wherein the phase locked loop comprises:

an input for application of a signal having a reference frequency;

an output for outputting an output signal for radio transmission;

a filter in a forward path of the loop for passing the baseband signal;

a mixer and a frequency divider in a feedback path of the loop, the mixer serving for downconverting the frequency of the loop output signal, the frequency divider connecting with an output terminal of the mixer and serving to scale the frequency of an output signal of the mixer to provide a signal having a downconverted frequency of substantially the reference frequency; and a modulator coupled to the input for modulating the baseband signal onto the signal having the reference frequency.

11. A radio transmitter as claimed in claim 10, further comprising a power amplifier coupled to the output of the phase locked loop for amplifying the signal to be transmitted.

12. A radio transmitter as claimed in claim 11, further comprising means for decomposing the baseband signal into a complex signal having polar coordinates, and for forwarding the amplitude part to the power amplifier and the phase part to the modulator, wherein the power amplifier is a variable amplifier which is responsive to the amplitude part of the baseband signal.

13. A radio transmitter as claimed in claim 10, further comprising an input frequency divider coupled to the input of the phase locked loop, for dividing the frequency of an input signal to a lower value of frequency.

14. A phase locked loop for upconverting and scaling the frequency of a baseband signal to a frequency for radio transmission, the phase locked loop comprising:

an input for application of a signal having a reference frequency;

an output for outputting an output signal for radio transmission;

a filter in a forward path of the loop for passing the baseband signal;

a mixer and a frequency divider in a feedback path of the loop, the mixer serving for downconverting the frequency of the loop output signal, the frequency divider connecting with an output terminal of the mixer and serving to scale the frequency of an output signal of the mixer to provide a signal having a downconverted frequency of substantially the reference frequency; and a modulator coupled to the feedback path for modulating the baseband signal onto the signal having the downconverted frequency.

15. A phase locked loop as claimed in claim 14, wherein the filter is a low pass filter for passing signals of audio frequency.

16. A phase locked loop as claimed in claim 14, further comprising a frequency source coupled to the mixer for generating a signal to be mixed with the output signal.

17. A phase locked loop as claimed in claim 16, wherein the frequency source is in the same frequency band as the frequency of the output signal.

18. A phase locked loop as claimed in claim 14 wherein the modulator comprises a phase modulator.

19. A phase locked loop as claimed in claim 18, wherein the modulator further comprises an integrator, coupled to the phase modulator, for integrating the baseband signal.

20. A phase locked loop as claimed in claim 14 wherein the modulator comprises an IQ modulator.

21. A phase locked loop as claimed in claim 14, arranged such that the frequency bands in which the reference frequency and the frequency of the output signal lie are spaced by at least one further frequency band.

22. A phase locked loop as claimed in claim 21, arranged to output a signal having a frequency in the UHF band when the reference frequency is in the LF band.

23. A radio transmitter comprising a phase locked loop for generating from a baseband signal a signal to be transmitted by the transmitter, wherein the phase locked loop comprises:

an input for application of a signal having a reference frequency;

an output for outputting the signal for radio transmission;

a filter in a forward path of the loop for passing the baseband signal;

a mixer and a frequency divider in a feedback path of the loop, the mixer serving for downconverting the frequency of the loop output signal, the frequency divider connecting with an output terminal of the mixer and serving to scale the frequency of an output signal of the mixer to provide a signal having a downconverted frequency of substantially the reference frequency; and a modulator coupled to the feedback path for modulating the baseband signal onto the signal having the downconverted frequency.

24. A radio transmitter as claimed in claim 23, further comprising a power amplifier coupled to the output of the phase locked loop for amplifying the signal to be transmitted.

25. A radio transmitter as claimed in claim 24, further comprising means for decomposing the baseband signal into a complex signal having polar coordinates, and for forwarding the amplitude part to the power amplifier and the phase part to the modulator, wherein the power amplifier is a variable amplifier which is responsive to the amplitude part of the baseband signal.

26. A radio transmitter as claimed in claim 23, further comprising an input frequency divider coupled to the input of the phase locked loop, for dividing the frequency of an input signal to a lower value of frequency.

27. A phase locked loop for upconverting and scaling the frequency of a baseband signal to a frequency for radio transmission, the phase locked loop comprising:

a phase detector having a first input for application of a signal having a reference frequency, the phase detector having a second input for receiving a signal from a feedback path of the loop;

an output for outputting the signal for radio transmission;

a filter in a forward path of the loop for passing the baseband signal;

a mixer and a frequency divider in a feedback path of the loop, the mixer serving for downconverting the frequency of the loop output signal, the frequency divider connecting with an output terminal of the mixer and serving to scale the frequency of an output signal of the mixer to provide a signal having a downconverted frequency of substantially the reference frequency; and a modulator coupled to the first input of the phase detector for modulating the baseband signal onto the signal having the reference frequency.

28. A phase locked loop as claimed in claim 27, wherein the filter is a low pass filter for passing signals of audio frequency.

29. A phase locked loop as claimed in claim 27, further comprising a frequency source coupled to the mixer for generating a signal to be mixed with the output signal.

30. A phase locked loop as claimed in claim 29, wherein the frequency source is in the same frequency band as the frequency of the output signal.

31. A phase locked loop for upconverting and scaling the frequency of a baseband signal to a frequency for radio transmission, the phase locked loop comprising:

a phase detector having a first input for application of a signal having a reference frequency, the phase detector having a second input for receiving a signal from a feedback path of the loop;

an output for outputting the signal for radio transmission;

a filter in a forward path of the loop for passing the baseband signal;

a mixer and a frequency divider in a feedback path of the loop, the mixer serving for downconverting the frequency of the loop output signal, the frequency divider connecting with an output terminal of the mixer and serving to scale the frequency of an output signal of the mixer to provide a signal having a downconverted frequency of substantially the reference frequency; and a modulator coupled to the second input of the phase detector for modulating the baseband signal onto the signal having the downconverted frequency.

32. A phase locked loop for altering the frequency of a baseband signal to a frequency for radio transmission, the phase locked loop comprising:

a phase detector having a first input for application of a reference signal having a reference frequency, the phase detector having a second input for receiving a feedback signal from a feedback path of the loop;

an output for outputting the signal for radio transmission;

a filter in a forward path of the loop for passing the baseband signal;

a mixer and a frequency divider in a feedback path of the loop, the mixer serving for offsetting the frequency of the loop output signal, the frequency divider connecting with an output terminal of the mixer and serving to scale the frequency of an output signal of the mixer to provide a signal having a feedback frequency of substantially the same value as the reference frequency; and a modulator coupled to one of the first and the second inputs of the phase detector for modulating the baseband signal onto the reference signal or the feedback signal.

33. A phase locked loop suitable for use in a communication device, comprising:

a phase detector having a first input terminal for receiving a first reference signal by a first signal line, said phase detector having a second input terminal for receiving a feedback signal via a second signal line, said phase detector having an output terminal for outputting a phase difference between signals on said first and said second signal lines;

a loop output for outputting a loop output signal suitable for use in radio transmission;

a phase modulator located in one of said first and said second signal lines for imparting a phase modulation to a signal on said one of said first and said second signal lines, said modulation appearing in said phase difference outputted by said phase detector, said phase difference being employed for generating said loop output signal;

offset means for offsetting a frequency of the loop output signal by an offset frequency; and a frequency scaler operative to scale the frequency of a signal outputted by said offset means to produce said feedback signal.

34. A phase locked loop according to claim 33 wherein said offset means comprises a mixer.

35. A phase locked loop according to claim 34, further comprising a filter in a forward path of the loop for passing said phase difference from said phase detector to said loop output, wherein said phase modulator has an input terminal for receiving a baseband signal, said baseband signal appearing in said phase modulation and in said phase difference outputted by said phase detector.

36. A phase locked loop according to claim 35 wherein said offset frequency is a second reference frequency, and said loop includes a source coupled to said mixer for providing said second reference frequency.

37. A phase locked loop according to claim 36 wherein said loop output comprises a VCO (voltage controlled oscillator), and said filter is a low-pass filter.

38. A phase locked loop according to claim 36 wherein the frequency of the signal outputted by said offset means is lower than a frequency of said loop output signal.

39. A phase locked loop according to claim 34 wherein said frequency scaler outputs a signal having a frequency lower than the frequency of an output signal of said mixer.

40. A phase locked loop according to claim 39 wherein said frequency scaler is a frequency divider.

41. A phase locked loop according to claim 39 wherein the frequency of the signal outputted by said mixer is lower than a frequency of said loop output signal.

* * * * *